United States Patent
Chi

(10) Patent No.: US 6,181,601 B1
(45) Date of Patent: Jan. 30, 2001

(54) FLASH MEMORY CELL USING P+/N-WELL DIODE WITH DOUBLE POLY FLOATING GATE

(75) Inventor: Min-hwa Chi, Hsinchu (TW)

(73) Assignee: Taiwan Semiconductor Manufacturing Corporation, Hsinchu (TW)

( * ) Notice: Under 35 U.S.C. 154(b), the term of this patent shall be extended for 0 days.

(21) Appl. No.: 09/454,490

(22) Filed: Dec. 2, 1999

(51) Int. Cl.$^7$ .................................................. G11C 11/34
(52) U.S. Cl. .............................. 365/185.18; 365/185.11
(58) Field of Search ........................... 365/185.11, 185.18

(56) References Cited

U.S. PATENT DOCUMENTS 5,912,842 * 6/1999 Chang et al. ................... 365/185.11

* cited by examiner

Primary Examiner—David Nelms
Assistant Examiner—M. Tran
(74) Attorney, Agent, or Firm—Blakely, Sokoloff, Taylor & Zafman, LLP

(57) ABSTRACT

A flash memory cell formed in a semiconductor substrate is disclosed. The cell includes an n-well formed within the substrate. Next, a p+ drain region is formed within the n-well. A floating gate is formed above the n-well being separated from the substrate by a thin oxide layer. The floating gate is formed adjacent to the p+ drain region. Finally, a control gate is formed above the floating gate, the floating gate and the control gate being separated by a dielectric layer. The new cell is read by measuring the GIDL current at p+/n-well junction, which is exponentially modulated by the floating gate potential (or its net charge). The new cell is programmed by band-to-band hot electron injection and is erased by F-N tunneling through the overlap area of floating gate and n-well.

7 Claims, 5 Drawing Sheets

FLASH MEMORY CELL USING P+/N-WELL DIODE WITH DOUBLE POLY FLOATING GATE

FIELD OF THE INVENTION

The present invention relates to flash memory, and more particularly, to a flash memory cell that uses a diode and double poly stack.

BACKGROUND OF THE INVENTION

The stack-gate ETOX-cell, one of the most popular cell structures for flash memories, is widely programmed by channel hot-electron (CHE) and erased by Fowler-Nordheim (FN) tunneling through the source side or the channel area.

The n-channel ETOX-cell is conventionally fabricated by a twin-well process or recently in a triple-well process as shown in FIG. 1. The triple-well structure is typically used to protect cells from noises generated outside the deep n-well by reverse-biasing the deep n-well to p-well junction, e.g., the deep n-well is biased to the highest potential (Vcc) and the p-well is biased to the lowest potential (Vss). The n+ source is typically doubly implanted by $As^{75}$ (with a high dose of $3E15/cm^2 \sim 1E16/cm^2$ for the n+ junction) and $P^{31}$ (with a lower dose of $\sim 1E14/cm^2$ for the n-junction) so that the source junction can be biased at high voltage (e.g. ~12 v) during erase operation. The n+ drain is typically implanted by As only with a high dose ($\sim 1E16/cm^2$) and the drain side does not need the lightly-doped-drain (LDD) implant and spacer structure.

Note that the LDD structure is not useful in an ETOX-cell, although it is important in CMOS transistors for reducing electrical field during switching for lower hot-electron generation. The tunnel oxide ($T_{ox}$) is typically 80–120 angstroms thick, the inter-poly dielectric ($T_{pp}$) typically consists of thin oxide-nitride-oxide (ONO) layers. As an example, a typical ETOX-cell based on 0.35 um CMOS design rule has the following cell parameters: $T_{ox}$ ~90 angstroms, $T_{pp}$ ~160 angstroms (oxide equivalent thickness), and control-gate to floating-gate coupling ratio of ~0.8.

The ETOX-cell of FIG. 1 is programmed by channel-hot-electrons (CHE). The bias for programming is typically: $V_d=7v$, $V_{cg}=9$ to 12 v, and $V_s=0$ v. Under these bias conditions, there is a large channel current (~1 mA/cell) for hot electron generation near the channel surface of the drain. Hot electrons are injected into the floating-gate when the oxide energy barrier is overcome and when assisted by the positive control gate bias. After programming, the amount of net electrons on the floating-gate increases, which results in an increase of the cell threshold voltage ($V_T$). The electrons in the floating-gate will remain for a long time (e.g. 10 years at room temperature), unless intentionally erased. The drawback of CHE programming is low injection efficiency and large power consumption during programming.

The cell is erased by Fowler-Nordheim (F-N) tunneling through the source side or the channel area. The bias during source side erase is typically: $V_d$~0 v or floating, $V_{cg}$~-5 v to 0 v, and $V_2$=+9 to +12 v. This establishes a large electrical field (~10 Mv/cm) across the tunnel oxide between the floating-gate and source overlap area. Electrons on the floating-gate will tunnel into the source and be removed away. It is known that there is large gate induced drain leakage (GIDL) current that occurs at the source side during erase as well as the associated degradation of the tunnel oxide.

The bias for F-N erase through the channel area is typically: $V_d$~floating, $V_{cg}$~15 v, $V_{pw}$~0 v. A large electrical field (-10Mv/cm) can be established across the tunnel oxide between the floating-gate and the p-well channel area (in accumulation). Electrons on the floating-gate will tunnel into the channel area and be removed through the p-well bias. It is well known that a high negative voltage is required on the control-gate and the tunnel oxide is easily degraded by the high electrical field during erase.

The read biases of the prior art ETOX-cell are typically: $V_d$~1 v to 2 v, $V_{cg}$~$V_{cc}$, $V_s$~0 v, $V_{pw}$~0 v, $V_{dnw}$=Vcc, and $V_{sub}$~0 v. The channel may be inverted or not depending on the net electron charge stored on the floating-gate, and results in the on and off of the cell as measured by the read current $I_{read}$ representing the digital information of "1" or "0" stored in the cell.

Turning to FIG. 2, another prior art flash cell is shown that uses band-to-band tunneling induced hot electron (BBHE) generation and injection. The cell is a p-channel ETOX cell that only uses electrons tunneling through the tunnel oxide. This can avoid oxide degradation by hole injection. The bias for programming the p-channel cell is shown in FIG. 2. Electrons are initially generated on the surface of the p+ drain by the known mechanism of band-to-band tunneling. They are further accelerated when flowing toward the n-well and gain energy through the electrical field in the p+/n-well junction. Hot electrons as generated by junction high field and impact ionization can overcome the oxide barrier with the help of positive bias on the control gate and are injected onto the floating gate. The initial electrons on the p+ drain can also be injected to the floating gate by Fowler-Nordheim tunneling if the electrical field across the oxide is large enough (about 10 Mv/cm). In short, the drain current during programming is contributed by three components: hot electron injection to the floating gate, Fowler-Nordheim tunneling to the floating gate, and GIDL current to the n-well. Note that the BBHE mechanism can be implemented only on a p-channel cell.

Nevertheless, each of these prior art approaches have disadvantages regarding size, current drain, and/or implementation as an array. What is needed is a method for manufacturing a flash cell having the advantages of small cell size and easily implemented as an array.

SUMMARY OF THE INVENTION

A flash memory cell formed in a semiconductor substrate is disclosed. The cell comprises: a deep n-well formed within said substrate; a p+ drain region formed within said deep n-well; a floating gate formed above said n-well, said floating-gate separated from said substrate by a thin oxide layer, said floating gate formed adjacent to said p+ drain region; and a control gate formed above said floating gate, said floating gate and said control gate separated by a dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
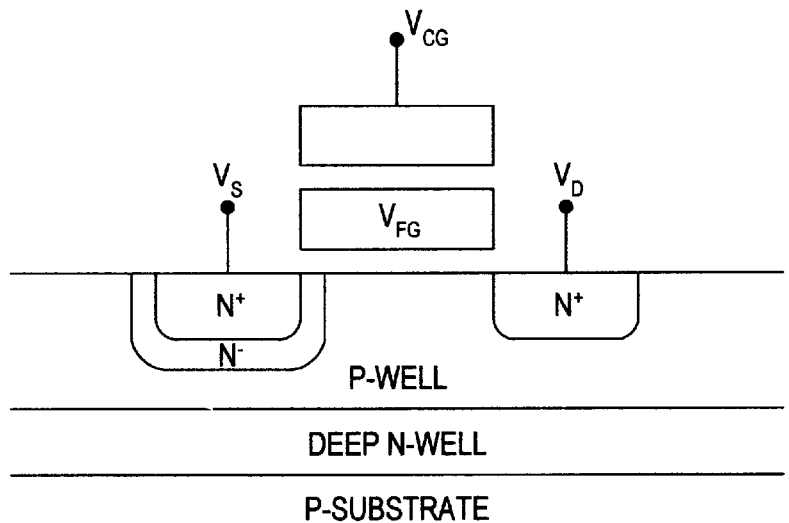
FIG. 1 is a schematic diagram of a prior art ETOX-cell formed by a triple-well process.
Figure 2:
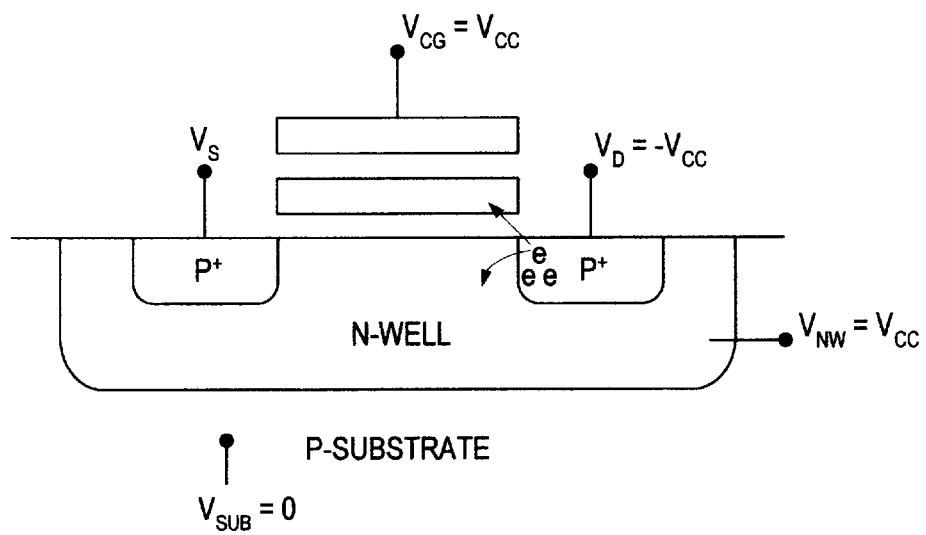
FIG. 2 is a schematic diagram of a prior art ETOX-cell using and-to-band tunneling hot electron (BBHE) injection.
Figure 3:
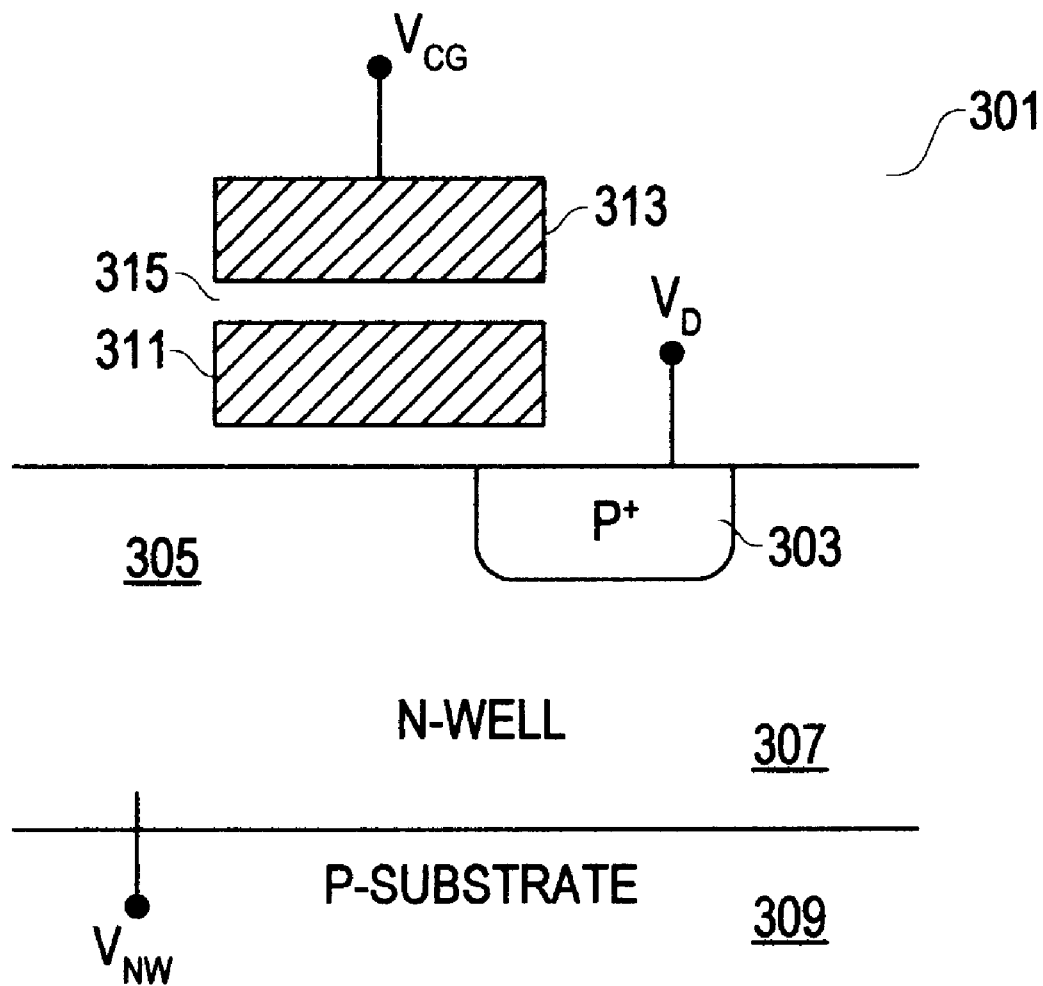
FIG. 3 is a schematic diagram of a flash memory cell formed in accordance with the present invention.

Turning to FIG. 3, an flash memory cell 301 formed in accordance with the present invention is shown. The cell 301 includes a p+ drain 303 formed in a n-well 307 that is formed in a p-type substrate 309. Formed atop of the n-well, but separated by a tunnel oxide, is a floating gate 311. The floating gate 311 is adjacent to the p+ drain 303. Formed atop of the floating gate 311, but separated by an interpoly dielectric 315, is a control gate 313.

Thus, many of the features are the same as in a conventional ETOX-cell. For example, for a 0.25 micron design rule, the tunnel oxide is ~85–105 angstroms thick, the interpoly dielectric 315 between the control gate 313 and the floating gate 311 is preferably a stack of oxide/nitride/oxide with about 100–180 angstroms (oxide equivalent) thickness. The control gate 313 has a coupling ratio to the floating gate 311 of about 0.7 to 0.9. For large gate induced drain leakage (GIDL) current generation, not only the overlap between the floating gate 311 and the p+ drain 303 should be enough (e.g. about 0.1 micron), but also the p-type doping level at the surface of the p+ drain 303 should be high enough (e.g. >20 dopants/cm$^3$).

Figure 4:
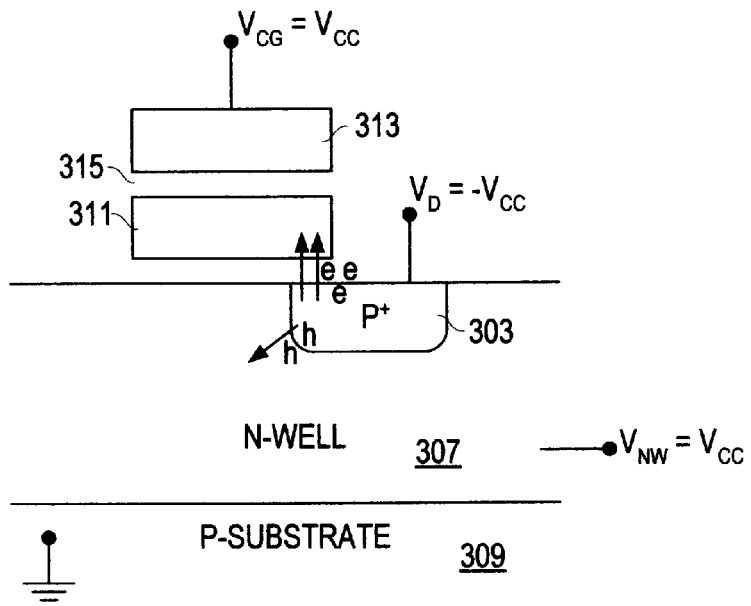
FIG. 4 is a schematic diagram of the cell of FIG. 3 during programming.

The operation of the cell 301 is described below. The cell 301 is programmed primarily by band-to-band induced hot electron (BBHE) injection. As seen in FIG. 4, the p+ drain 303 bias ($V_d$) is $V_{cc}$ or higher (e.g. 3 to 5 volts), the control gate 313 bias ($V_{cg}$) is $V_{cc}$, the n-well ($V_{dnw}$) is biased to $V_{cc}$, and the p-substrate 309 is grounded.

Electrons are generated on the surface of the p+ drain 303 by band-to-band tunneling. These electrons are accelerated (gaining energy to become "hot") by the p+/n-well junction bias. These hot electrons can overcome the energy barrier and become injected onto the floating gate 311. The injection is also helped by the positive bias on the control gate 313.

Furthermore, the initial electrons appearing on the surface p+ drain 303 can also be injected directly to the floating gate by FN tunneling if the electrical field across the oxide is large enough (~10Mv/cm). In short, the total drain current during programming has three components: (1) hot electron injection to the floating gate 311, (2) electrons FN tunneling to the floating gate 311, and (3) gate induced drain leakage (GIDL) current to the n-well 307. Note that the BBHE mechanism can only be implemented on a p-channel cell. In a practical design, programming is dominantly contributed by hot electron injection, with negligible contribution from FN tunneling.

Figure 5:
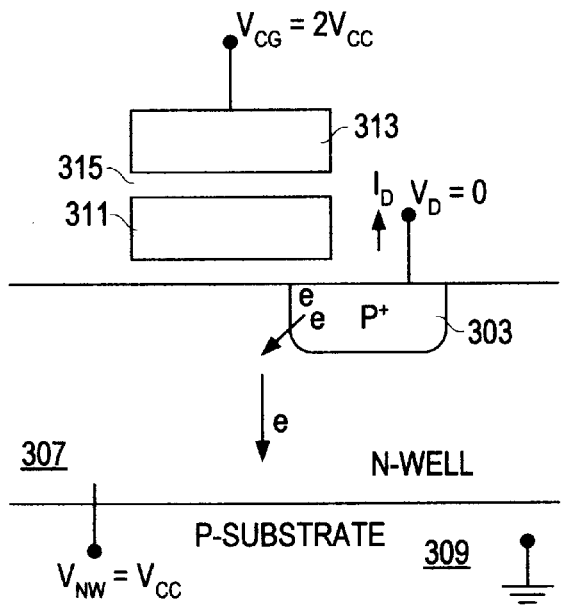
FIG. 5 is a schematic diagram of the cell of FIG. 3 during a read operation.

Next, turning to FIG. 5, the read operation of the cell 301 is next described. The read operation is based on the fact that the gate induced drain leakage (GIDL) current at the p+ drain 303 is strongly (exponentially) dependent on the electrical field between the p+ drain 303 and the floating gate 311. As a result, it is sensitive to the net electron charge on the floating gate. The preferred bias for the read operation is as follows: $V_{cg}$ is $2V_{cc}$ (6.6 volts); $V_d$ is 0 volts; $V_{pw}$ is 0 volts; and $V_{nw}$ is $V_{cc}$ (about 3.3 volts). The GIDL current of a programmed cell (i.e. with net electron charge on the floating gate) will be at least 3 orders of magnitude smaller than that of a non-programmed cell (i.e. no net electron charge on the floating gate).

Figure 6:
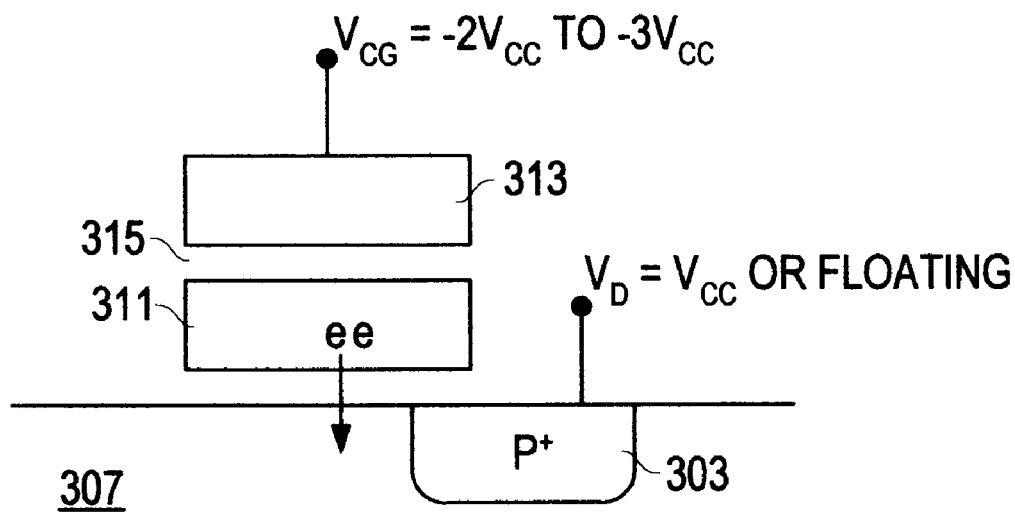
FIG. 6 is a schematic diagram of the cell of FIG. 3 during an erase operation.
Figure 6:
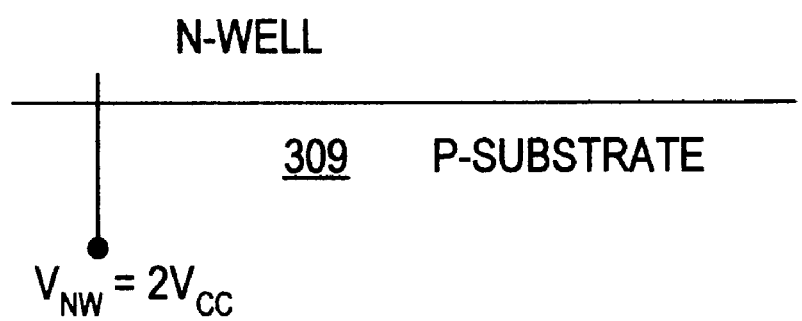

Turning to FIG. 6, the erase action of the cell 301 can be seen. It is similar to conventional Fowler-Nordheim tunneling through the channel. There is a high enough field (>10 MV/cm) established between the p+ drain 303 and the floating-gate 311 so that electrons on the floating-gate 311 can tunnel by FN tunneling into the channel/drain/source area and be removed away. Preferably, the control gate $V_{cg}$ is at $-2V_{cc}$ to $-3$ $V_{cc}$, the n-well $V_{nw}$ is at $2V_{cc}$, and $V_d$ is at $V_{cc}$ or floating.

There are several advantages of the cell 301 of the present invention and its operation. First, compared to an ETOX cell, there is no source and thus no need for a source interconnection. The cell 301 is therefore significantly smaller than a conventional p-channel ETOX cell.

Second, the p+ drain 303 does not carry a large current during all operations. Therefore, a buried p+ line (i.e. diffusion area used as n+ drain) is suitable for cell operations. This will eliminate the contact and metal interconnect of n+ drains and further reduce the cell size.

Third, as will be seen below, the array architecture with separate column n-wells can implement single-bit erase for full function EEPROM. Finally, the GIDL read operation is insensitive to temperature due to the nature of the GIDL mechanism.

Figure 7:
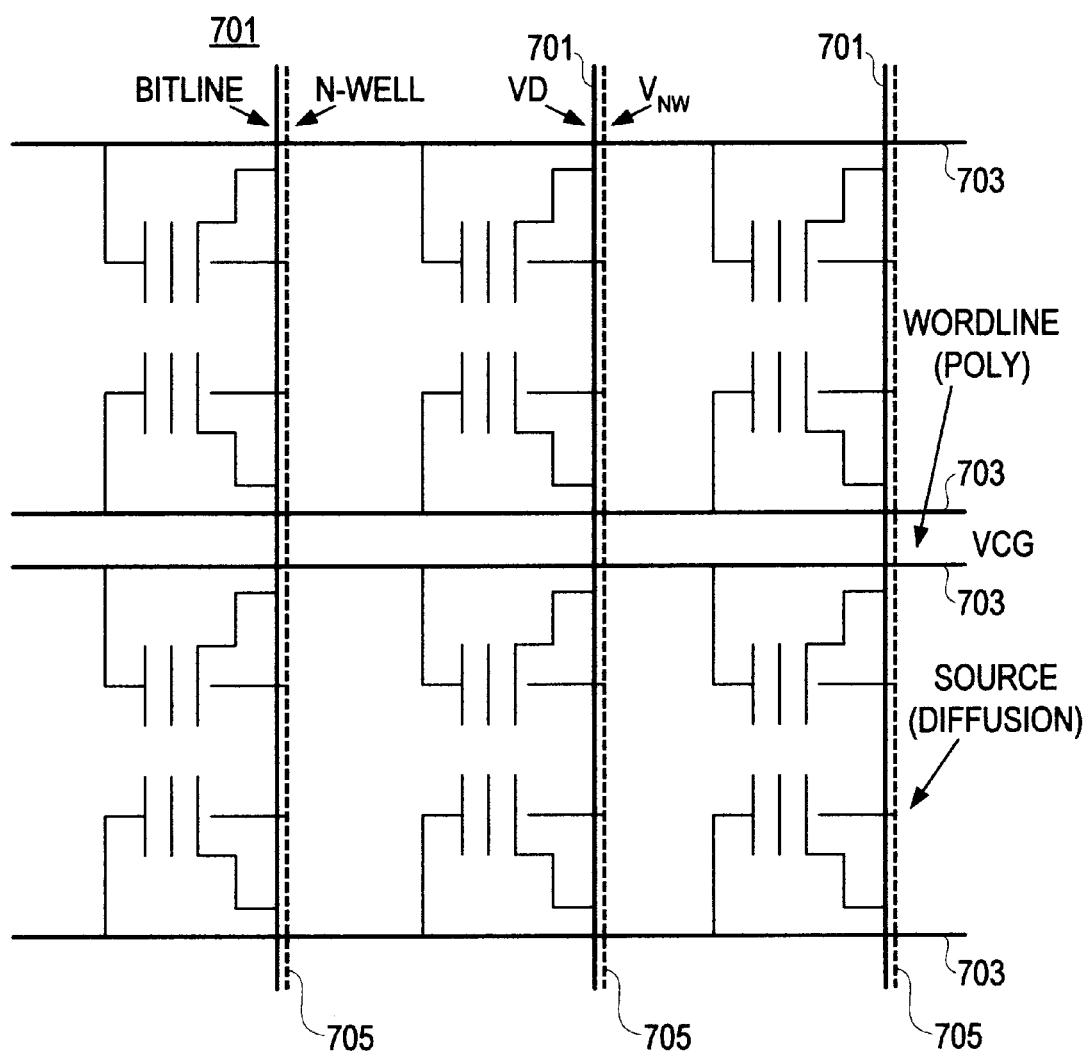
FIG. 7 is a NOR array formed from the cells of the present invention.

The cells 301 disclosed herein can be advantageously configured into a NOR array as shown in FIG. 7 with the following features. The p+ drains of cells in a common column are connected to a column bitline 701 through a buried p+ region (contactless array) or by a conventional contact and metal line. The n-wells of cells in a column are fabricated in one n-well 705. The n-well of each column is isolated from adjacent n-wells. Note that if single-bit erase is not needed, then only one large n-well underneath the entire array is needed. The control gate of cells in a common row are connected to the row wordlines 703. There is no need for a source connection. This results in a simpler array architecture and wordline decoder design.

During programming of a single cell, the bias of the selected column bitline 701 ($V_d$) is $-V_{cc}$ (e.g. −3.3 volts) and the selected row wordline 703 is bias ($V_{cg}$) to high ($V_{cc}$). The n-well ($V_{nw}$) is biased to $V_{cc}$ and the p-substrate is biased to 0 volts during all operations. All non-selected column bitlines 701 are biased to 0 volts and the non-selected wordlines 703 are biased to 0 volts.

To program cells in an entire row, all column bitlines 701 are selected and biased according to the input digital information (e.g. bitline bias to −3.3 volts as a "1" and 0 volts as a "0"). All column n-well lines are biased to $V_{cc}$ and the p-substrate is biased to 0 volts. The selected row wordline is biased to high ($V_{cc}$); all non-selected wordlines are biased to 0 volts.

To program all cells in a column, then all row wordlines 703 are selected and biased according to the input digital information (e.g. $V_{cc}$ for a logical "1" and 0 volts for a logical "0"). The selected column n-well 705 is biased to $V_{cc}$. The selected column bitline 701 is biased to $-V_{cc}$ or −3.3 volts, and all non-selected bit-lines are biased to 0 volts. In short, either single bit programming, column programming, or row programming can be implemented in this array with high efficiency.

During the read operation, the selected row wordline 703 is biased to high (e.g. $2V_{cc}$), and selected column bitlines

701 is biased to 0 volts. All non-selected row wordlines 703 and all non-selected bitlines 701 are biased to low (i.e. 0 volts) to avoid disturb. The n-wells 705 are biased to $V_{cc}$ and the p-substrate is biased to 0 volts. The magnitude of the GIDL current measured in a column bitline represents the digital information stored in the cell. Those cells programmed with (negative) electron charge on the floating-gate will have about 3 orders of magnitude less GIDL current than those without electrons on the floating-gate.

During the erase operation, cells in a selected row wordline 703 can be erased by biasing the wordline to low (e.g. $-2V_{cc}$ to $-V_{cc}$), while biasing the column n-well line 705 to high ($2V_{cc}$). Further, the column bitline 701 is either left floating or biased to $V_{cc}$ during erase. Non-selected rows (wordlines) are biased to 0 volts and all non-selected n-wells are biased to $V_{cc}$. Certainly, more than one row or even all rows can be selected and erased efficiently.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A flash memory cell formed in a semiconductor substrate comprising:

a deep n-well formed within said substrate;

a p+ drain region formed within said n-well;

a floating gate formed above said n-well, said floating-gate separated from said substrate by a thin oxide layer, said floating gate formed adjacent to said p+ drain region; and a control gate formed above said floating gate, said floating gate and said control gate separated by a dielectric layer, wherein said flash memory cell does not have an associated source region.

2. The cell of claim 1 wherein the cell is programmed by:

positively biasing said control gate and said n-well to $V_{cc}$; and negatively biasing said p+ drain region to $-V_{cc}$.

3. The cell of claim 2 wherein during programming said substrate is grounded.

4. The cell of claim 1 wherein the cell is erased by:

biasing said n-well to $2V_{cc}$; and biasing said control gate to about $-2V_{cc}$.

5. A flash memory cell formed in a semiconductor substrate comprising:

a deep n-well formed within said substrate;

a p+ drain region formed within said n-well;

a floating gate formed above said n-well, said floating-gate separated from said substrate by a thin oxide layer, said floating gate formed adjacent to said p+ drain region and a control gate formed above said floating gate, said floating gate and said control gate separated by a dielectric layer, wherein the cell is read by:

biasing said n-well to $V_{cc}$;

biasing said p+ drain to 0 volts; and biasing said control gate by a voltage sufficient to induce Fowler-Nordheim tunneling into the n-well.

6. The cell of claim 5 wherein said control gate is biased to $2V_{cc}$.

7. A NOR array architecture allowing single bit, row, and column programming and erase operations, said NOR array architecture comprising:

a plurality of flash memory cells formed in a substrate, each of said cells having:

(1) a n-well formed within said substrate;

(2) a p+ drain region formed within said n-well;

(3) a floating gate formed above said n-well, said floating-gate separated from said substrate by a thin oxide layer, said floating gate formed adjacent to said p+ drain region; and (4) a control gate formed above said floating gate, said floating gate and said control gate separated by a dielectric layer, wherein said flash memory cell does not have an associated source region;

wherein said cells are formed into a two-dimensional array including a plurality of rows and a plurality of columns;

further wherein each of said control gates of said cells sharing a common row are connected to a common row wordline;

further wherein each of said p+ drain region said cells sharing a common column are connected to a common column bitline; and further wherein said cells in a column share a common n-well.

* * * * *